(12) United States Patent
Trobough

(10) Patent No.: US 6,971,887 B1
(45) Date of Patent: Dec. 6, 2005

(54) MULTI-PORTION SOCKET AND RELATED APPARATUSES

(75) Inventor: Mark B. Trobough, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/877,323

(22) Filed: Jun. 24, 2004

(51) Int. Cl.[7] .......................................... H01R 12/00
(52) U.S. Cl. ...................................................... 439/71
(58) Field of Search ................... 439/68–73

(56) References Cited

U.S. PATENT DOCUMENTS

| | | | | |
|---|---|---|---|---|
| 4,552,422 A | * | 11/1985 | Bennett et al. ............... | 439/69 |
| 5,383,787 A | * | 1/1995 | Switky et al. ................ | 439/67 |
| 5,859,538 A | * | 1/1999 | Self ............................ | 324/755 |
| 6,144,559 A | * | 11/2000 | Johnson et al. ............. | 361/760 |
| 6,193,550 B1 | * | 2/2001 | Yamashita et al. .......... | 439/594 |
| 6,270,356 B1 | * | 8/2001 | Hoshino et al. .............. | 439/70 |
| 6,347,946 B1 | * | 2/2002 | Trobough et al. ............. | 439/70 |
| 6,524,116 B2 | * | 2/2003 | Davison et al. .............. | 439/70 |
| 6,527,597 B1 | * | 3/2003 | Harper, Jr. ................... | 439/701 |
| 6,679,707 B1 | * | 1/2004 | Brodsky et al. ............. | 439/71 |
| 6,707,684 B1 | * | 3/2004 | Andric et al. ................ | 361/785 |
| 6,709,277 B2 | * | 3/2004 | Ruttan et al. ................ | 439/66 |

* cited by examiner

Primary Examiner—Ross Gushi
(74) Attorney, Agent, or Firm—Schwabe, Williamson & Wyatt, PC

(57) ABSTRACT

A multi-portion socket, related components, and systems having such socket/components are described herein.

11 Claims, 15 Drawing Sheets

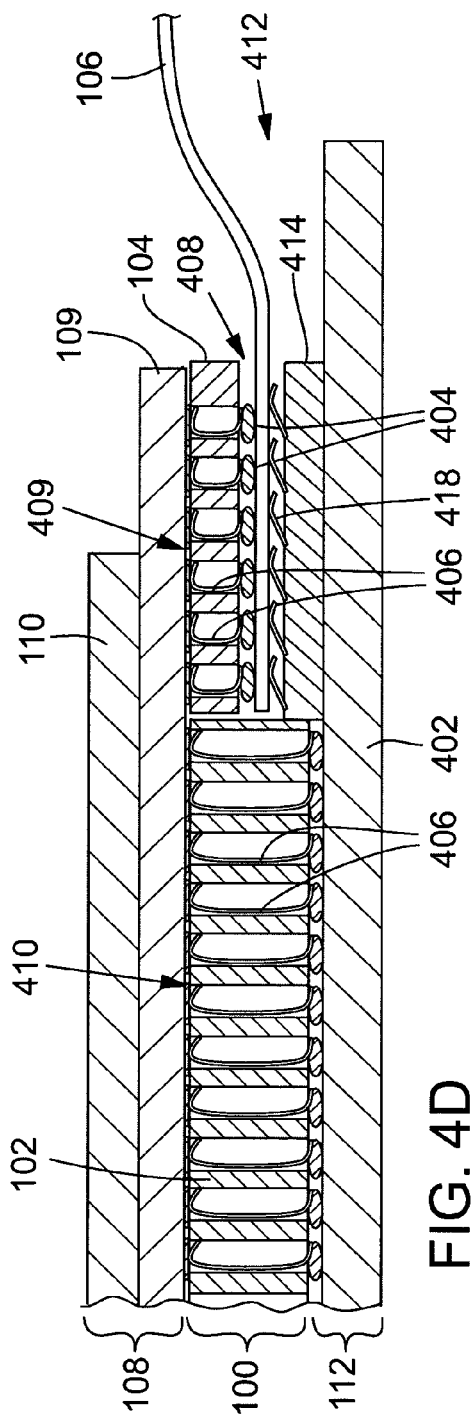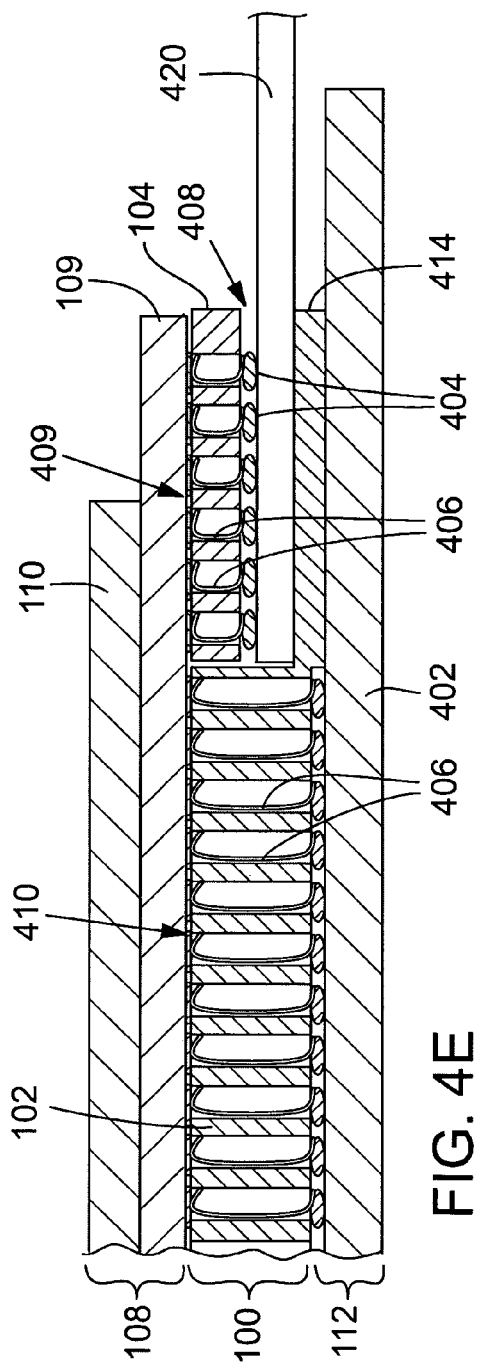

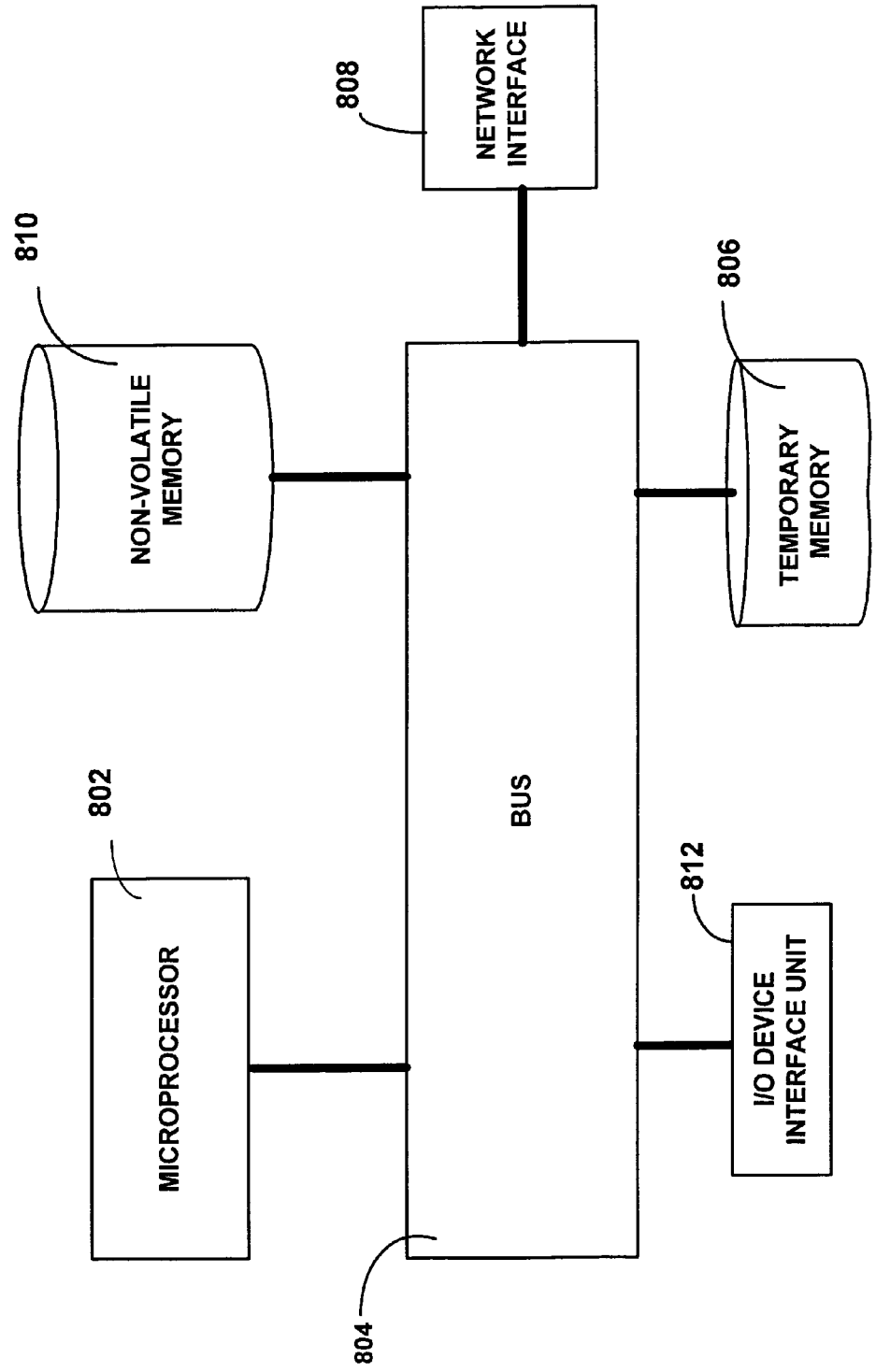

MULTI-PORTION SOCKET AND RELATED APPARATUSES

BACKGROUND OF THE INVENTION

1. Field of the Invention

The present invention relates to, but is not limited to, electronic devices, and in particular, to the field of electronic connections.

2. Description of Related Art

In the current state of integrated circuit technology, electronic devices such as a central processing unit (CPU), volatile memory, system on chip (SOC), and the like, are typically assembled into electronic packages. These electronic packages will commonly have a mating surface that is populated with conductive contacts or pads that are electrical contact points or interfaces for various signal, ground and power paths. The electronic packages and in some cases, the electronic devices themselves, are usually directly or indirectly mounted onto an underlying carrier or circuit board, such as, for example, a printed circuit board (PCB), a printed circuit card (PCC), a motherboard, and the like, via a surface mounted socket. The circuit boards, in turn, will electrically couple these mounted electronic packages or electronic devices to other components via conductive interconnects that are typically embedded in and/or are on the circuit board.

BRIEF DESCRIPTION OF THE DRAWINGS

Embodiments of the present invention will be described referencing the accompanying drawings in which like references denote similar elements, and in which:

FIG. 4D illustrates a side view of an electronic component, socket and circuit board substrate in accordance with some embodiments;

FIG. 4E illustrates a side view of an electronic component, socket and circuit board substrate in accordance with some embodiments;

FIG. 8 is a block diagram of an example system, in accordance with some embodiments.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

The following description includes terms such as on, onto, over, top, underlying and the like, that are used for descriptive purposes only and are not to be construed as limiting. That is, these terms are terms that are relative only to a point of reference and are not meant to be interpreted as limitations but are instead, included in the following description to facilitate understanding of the various aspects of the invention.

According to various embodiments of the invention, a circuit board is provided that includes a multi-portioned receiver for receiving an electronic component, the multi-portioned receiver being coupled to an external substrate. For these embodiments, the external substrate may include a dielectric with a lower electrical loss tangent value than a dielectric that comprises the circuit board substrate. An electronic component, according to these embodiments, may be, for example, an electronic package that includes one or more electronic devices, heat dissipation components and one or more substrates. An electronic component may also be an electronic device without a package such as a die or a chip, a chipset, or any other electronic component having multiple conductive contacts or pads. An electronic device may be a central processing unit, system on chip (SOC), graphical co-processor, a digital signal processor, volatile memory, input/output device, chipset input/output hub, memory controller or other electronic devices. In various embodiments, the receiver, such as a socket, may be mounted on the circuit board, or may be embedded within the circuit board itself. The receiver may be comprised of at least two detachable portions, at least one of the portions being coupled to the external substrate.

Figure 1:
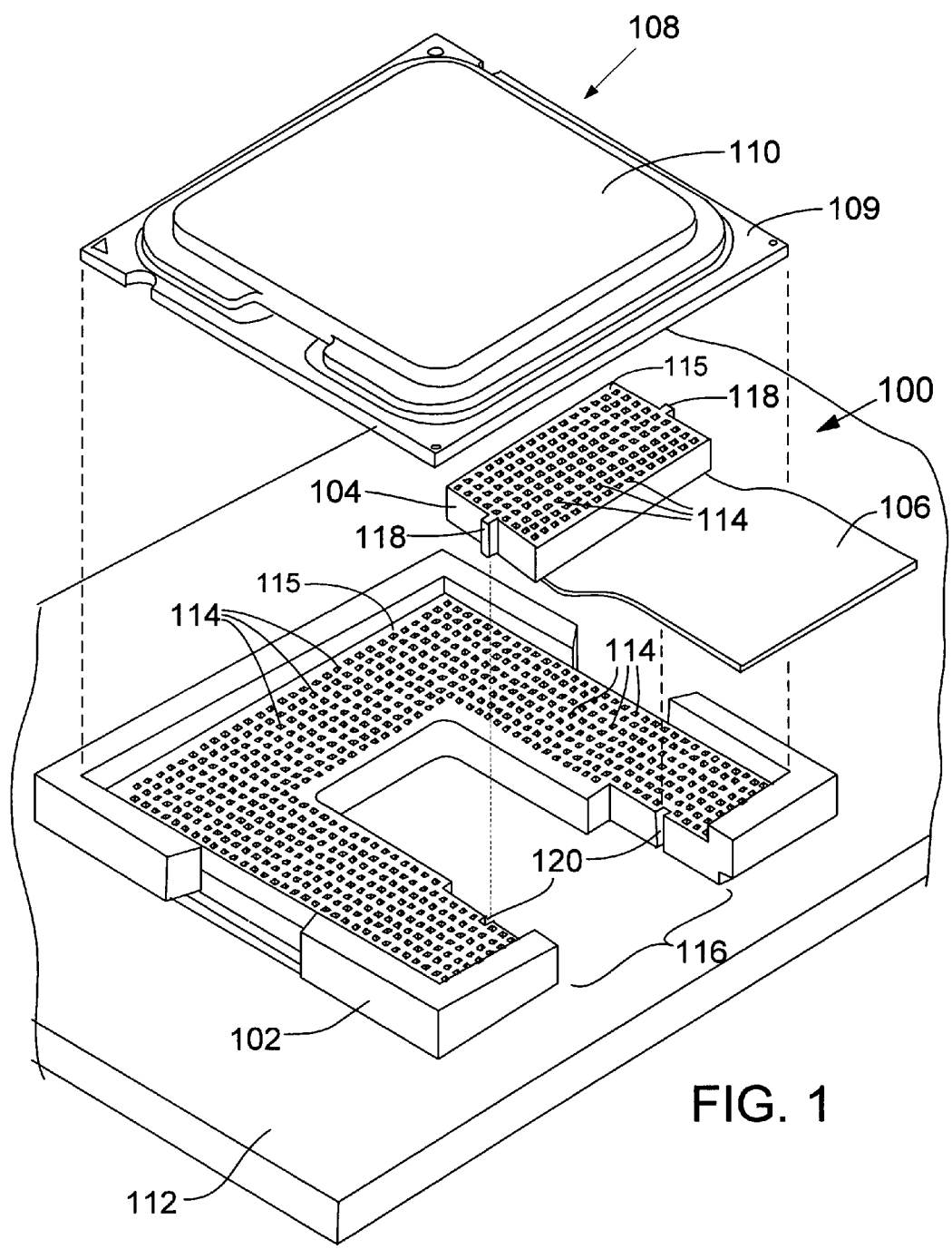
FIG. 1 illustrates an exploded view of a circuit board assembly that includes a circuit board substrate and a first and a second socket elements, the first socket element being attached to an external substrate in accordance with some embodiments.

FIG. 1 depicts an exploded view of a circuit board assembly that includes an electronic component and a receiver having two portions or elements, one of which is coupled to an external substrate, in accordance with various embodiments. For the embodiments, the receiver is a socket 100 that includes two detachable socket portions, a first socket element 102 and a second socket element 104. The second socket element 104 may be electrically coupled to an external substrate 106, while the first socket element 102 may be electrically coupled to a circuit board substrate 112. The socket 100 may receive an electronic component 108 that includes, in this case, a package substrate 109, an electronic device (not shown) such as a CPU, and a heat spreader 110.

In these embodiments, the first socket element 102 has a U-shape with an adaptedly shaped opening that allows the second socket element 104 to be received in the opening. When combined, the two socket elements 102 and 104 may form a socket having a substantially rectangular shape. In other embodiments, however, the first and second socket elements 102 and 104 may take on other shapes, thus resulting in a socket that may have a different shape other than a substantially rectangular shape.

For the embodiments, the electronic component 108 may be but is not limited to a land grid array (LGA) package, a micro pin grid array (mPGA) package, a pin grid array (PGA) package, and any other type of packages or electronic device that may be mounted onto, for example, a socket. In other embodiments, the electronic component 108 may be a bare electronic device, without a packaging substrate, that may be directly mounted onto a circuit board such as certain types of CPUs. In various embodiments, the electronic component 108 may include a flip-chip or other types of chips such as a wire-bonded chip. The package substrate 109 may be made of one or more dielectric and/or ceramic layers. Interconnects, such as vias and traces, may be included in the package substrate 109 and may electrically couple the various signal, ground and power paths of the electronic device in the electronic component 108 to the socket 100. In some embodiments, the package substrate 109, along with its interconnects, may be configured to direct selected signals, such as higher speed signals that are transmitted to and from the electronic device through a particular portion of the package substrate 109, while slower speed signals, ground and power may be directed through other portions of the package substrate 109.

Figure 2:
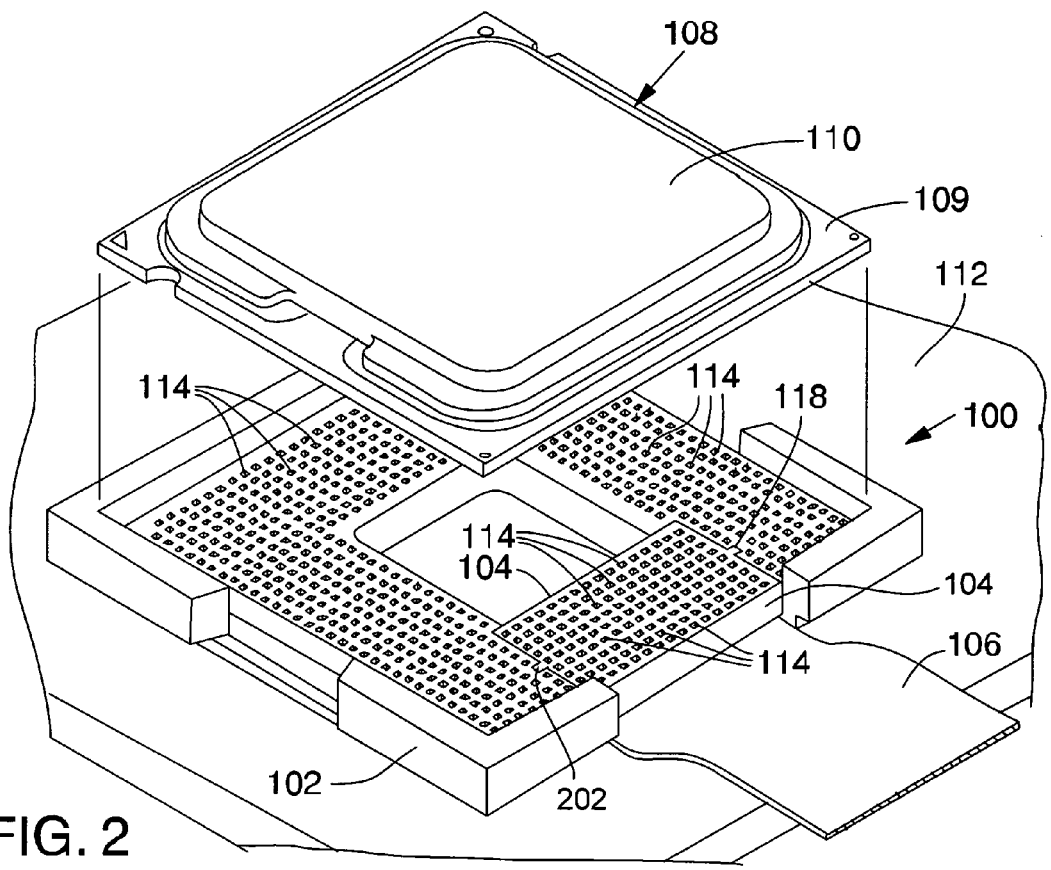
FIG. 2 illustrates the assembly of FIG. 1 when the second socket element has been coupled to the first socket element to form a complete socket in accordance with some embodiments.

In various embodiments, the socket 100 may receive electronic packages having multiple conductive contacts. For these embodiments a first socket element 102 and a second socket element 104 may combine to form the complete socket 100 (as depicted in FIG. 2). Each of the first and second socket elements 102 and 104 may include mating surfaces 115 that may interface with the package substrate 109 when the electronic component 108 is coupled to the first socket element 102 and the second socket element 104. For the embodiments, electrical contacts or connections, such as conductive elements or contacts (see FIG. 4A, ref. 406), may be contained in the apertures 114 of the first socket element 102 and the second socket element 104. The first socket element 102 may include a receiving feature such as a gap 116 where the second socket element 104 may be inserted. Note that in these embodiments, the gap 116 is depicted as being a complete cut-through that creates a disconnecting void in the first socket element 102 thus leaving the surface of the underlying circuit board substrate 112 exposed. However, in other embodiments, the gap 116 may not be a complete cut-through and thus will not result in the socket element 102 having a U-shape. Note further that in other embodiments, multiple socket elements may be inserted into the gap 116, each of the multiple socket elements may further be coupled to different substrates. The first socket element 102 and/or the second socket element 104 may be configurably shaped such that the second socket element 104 fits into the gap 116 of the first socket element 102. For these embodiments, the second socket element 104 may include ears 118 to configurably fit into notches 120 on the side walls of the first socket element 102, the notches 120 being part of the receiving feature (e.g., gap 116) of the first socket element 102.

In various embodiments, the receiving feature (e.g., gap 116) may be used to mate with or receive one or more socket portions (e.g., second socket element 104). Although the receiving feature is depicted as being a gap 116 in FIG. 1, in various other embodiments, the receiving feature may be an adaptedly shaped portion of the first socket element 102 that may receive or mate with additional socket portions. For example, in some embodiments, instead of a complete cut-through gap, the receiving feature may be a slot formed on the first socket element 102 where the second socket element 104 may be inserted. As will be recognized by those skilled in the art, other variations are also possible.

The circuit board substrate 112 may be electrically coupled to the first socket element 102 according to various embodiments. For the embodiments, the circuit board substrate 112 may be comprised of multiple interconnects, such as vias and traces, that are embedded in the circuit board substrate 112. These interconnects may represent separate signal, power and/or ground paths. In various embodiments, the circuit board substrate 112 may comprise of one or more layers of dielectrics. The dielectrics that make up the circuit board substrate 112 may have specific electrical loss tangent values associated with them. For example, according to one embodiment, the circuit board substrate 112 may be comprised of Fire Retardant-4 (FR4) dielectric having an electrical loss tangent value of about 0.020 to about 0.025.

According to some embodiments, the external substrate 106 may be external or physically detached from the circuit board substrate 112. In various embodiments, the external substrate 106 may be located adjacent to or on top of the surface of the circuit board substrate 112. The external substrate 106 may be comprised of multiple signal paths. For the embodiments, the external substrate 106 may further be comprised of a dielectric that may minimize signal loss particularly when the signal or signals are being transferred at a high rate. In various embodiments, the electrical loss tangent value of the dielectric comprising the external substrate 106 may be a fraction of the electrical loss tangent value of the dielectric that comprises the circuit board substrate 112. In some embodiments, the electrical loss tangent for the dielectric comprising the external substrate 106 is less than or equal to 0.010. In one embodiment, for example, the electrical loss tangent is from about 0.001 to about 0.005. Dielectrics used for the external substrate 106 may include but are not limited to a polytetrafluoroethylene (PTFE) dielectric, a polyimide dielectric, a liquid crystal polymer dielectric, and the like.

The external substrate 106, which may be physically disjoined or detached from the circuit board substrate 112, may be used to carry multiple signals between the electronic component 108 and, for example, other electronic devices according to some embodiments. For the embodiments, the signals being carried by the external substrate 106 may be signals of higher speed than signals that may be transmitted through the circuit board substrate 112 according to various embodiments. Note that for these embodiments, the speed of a signal relates to the amount of data being transferred per given time period (e.g., bits or data transferred per second). In one embodiment, signals that may transfer through the external substrate 106 is transferred at a rate of 12 GT/s+at a distance of around 6 inches. Of course, these numbers will vary depending upon several factors including for example, the type of material that comprises the external substrate 106.

In some embodiments, the first socket element 102 may facilitate slower speed signals destined for or originating from the electronic component 108 while higher speed signals destined for or originating from the electronic component 108 may be facilitated by the second socket element 104. For these embodiments, the references to higher speed signals and slower speed signals are in reference to the signals of different speeds that may be channeled through the first and second socket elements 102 and 104. In various embodiments, ground and power connection for the electronic component 108 may further be facilitated by the first socket element 102.

Referring to FIG. 2, which depicts the first socket element 102 and the second socket element 104 of FIG. 1 combined or mated to form a complete socket 100 according to various embodiments. For the embodiments, the ears 118 (as shown in FIG. 1) of the second socket element 104 has been inserted into the notches 120 (as shown in FIG. 1) of the first socket element 102 as indicated by ref. 202. When the electronic component 108 is coupled to the socket 100, the second socket element 104 may carry or transmit signals to and from the electronic component 108. These signals may further be carried by the external substrate 106 to and from other components (not shown) that may be directly or indirectly coupled to the external substrate 106. As previously discussed, in various embodiments, the signals that are facilitated by second socket element 104 and the external substrate 106 may be of higher speed than the signals that are facilitated by the first socket element 102 and the circuit board substrate 112.

Figure 3:
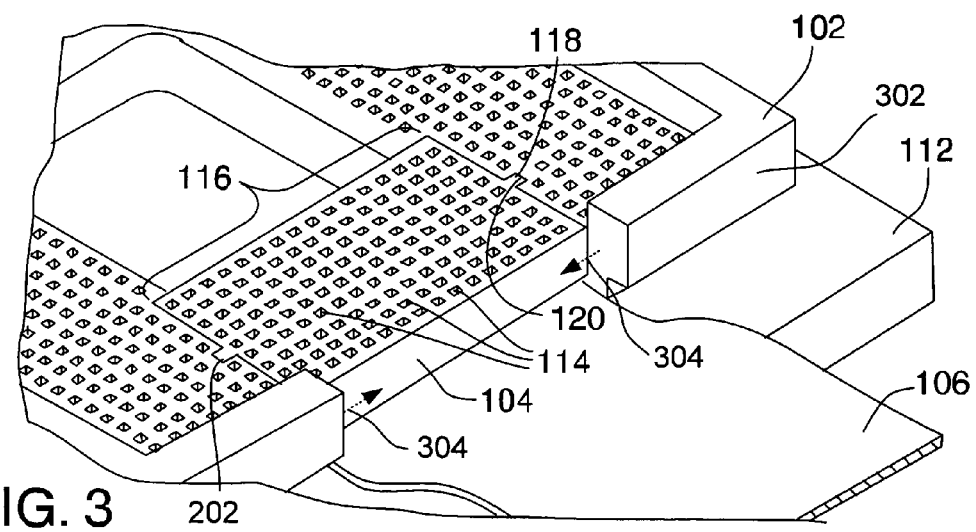
FIG. 3 illustrates the first and second socket elements of FIG. 2, in further detail, in accordance with some embodiments.

FIG. 3 depicts the first socket element 102 and the second socket element 104 of FIG. 2, in further detail, according to some embodiments. For the embodiments, an aligning component or components may be included with the first socket element 102 and/or the second socket element 104 that may align and/or lock into place the second socket element 104. In this case, the aligning components are the ears 118 (see FIG. 1) of the second socket element 104 and the notches 120 (see FIG. 1) of the first socket element 102. The ears 118 may be adapted to slide or fit into the notches 120 as indicated by ref. 202 in FIGS. 2 and 3. The notches 120 and the ears 118 may assure that the first socket element 102 and the second socket element 104 are aligned and mated properly. Various other aligning components, however, may be used in order to assure that the second socket element 104 properly mates with the first socket element 102 in other embodiments. For example, in one embodiment, the retaining wall 302 of the first socket element 102, which may be used to hold in place the electronic component 108, may be extended inwards as indicated by ref. 304. As a result, the retaining wall 302 may also facilitate in holding in place, the second socket element 104. In such an embodiment, the width of the external substrate 106 may be correspondingly reduced to fit between the extended walls 302. In yet another embodiment, the notches 120 may be on the second socket element 104 instead of the first socket element 102 while the ears 118 is located on the first socket element 102 instead of on the second socket element 104 (see FIG. 1).

Figure 4A:
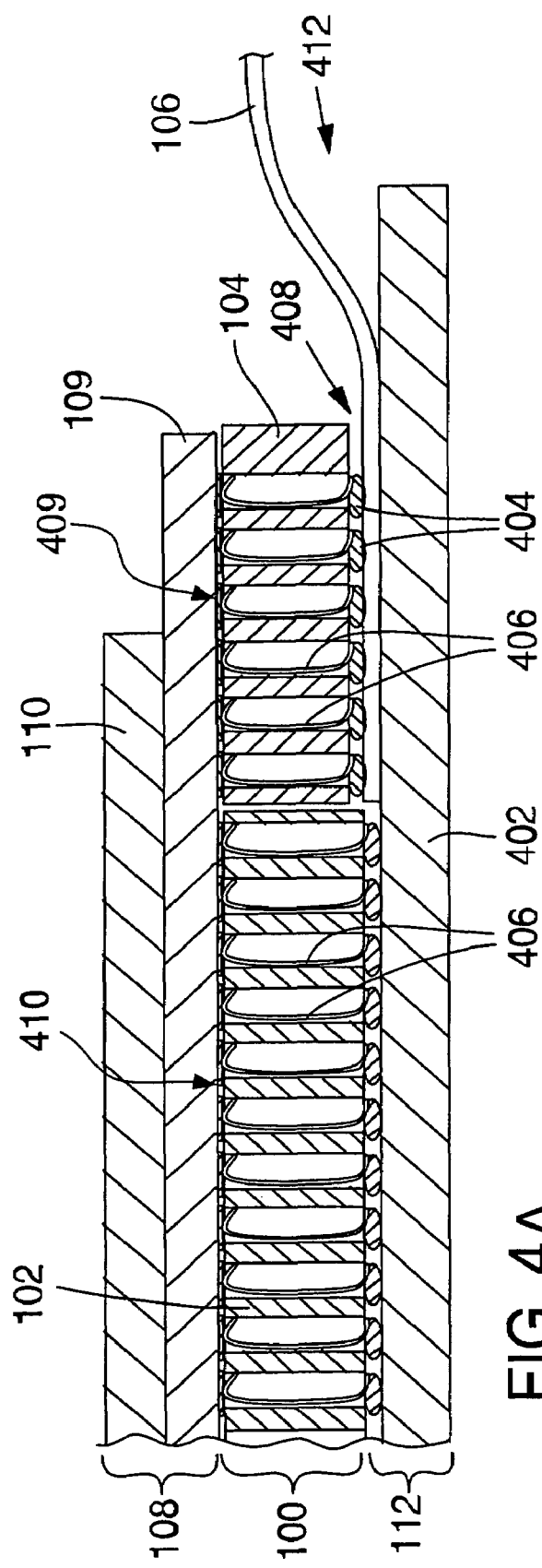
FIG. 4A illustrates a side view of the assembly of FIGS. 1 and 2 after the assembly is assembled in accordance with some embodiments.

FIG. 4A depicts a cross-sectional view of the electronic component 108, socket 100 and circuit board substrate 112 of FIGS. 1 to 3 after being combined to form a circuit board assembly according to some embodiments. For the embodiments, the electronic component 108 is on top of the socket 100, which is further on top of the circuit board substrate 112. The electronic component 108, which comprises of an electronic device such as a CPU or memory device, is electrically coupled to the package substrate 109. The socket 100 having the first socket element 102 that is electrically coupled to the circuit board substrate 112 via solder balls 402. For the embodiments, the socket 100 further includes the second socket element 104, which is electrically coupled to the external substrate 106 via solder balls 404. Each of the first socket element 102 and second socket element 104 may include multiple contacts 406 to electrically couple the package substrate 109 to the circuit board substrate 112 and the external substrate 106. The ends of the contacts 406 may protrude out of the top and bottom surfaces of the first socket element 102 and the second socket element 104 forming contact elements for electrically coupling the package substrate 112 to the external substrate 106 and the circuit board substrate 112.

For the embodiments, the second socket element 104 having a smaller height or thickness than the first socket element 102. As a result of this difference in height, a gap 408 is formed between the second socket element 104 and the circuit board substrate 112. For these embodiments, one end of the external substrate 106 is placed in the gap 408 and electrically coupled to the second socket element 104 via solder balls 404. In various embodiments, the height or thickness of the second socket element 104 may be reduced such that the gap 408 may be widened to allow for, for example, a thicker external substrate 106 to be inserted into the gap 408.

The package substrate 109 may be comprised of multiple interconnects (not shown) such as vias and traces according to some embodiments. These interconnects may be associated with various signal, ground and power paths for the electronic device contained in the electronic component t 108. For the embodiments, the interconnects, which may include traces and/or vias, may electrically couple the electronic device to the contacts 406 in the first socket element 102 and the second socket element 104 through conductive contacts (not shown) on the bottom surface of the package substrate 109. In some embodiments, selected signals such as higher speed signals traveling to and from the electronic component 108 may be channeled through the portion of the package substrate 109 surface that interfaces the second socket element 106 as indicated by ref. 409. For these embodiments, slower signals may be channeled through the package substrate 109 surface that interfaces the first socket element 102 as indicated by ref. 410. Further, ground and/or power may also be channeled through the package substrate 109 surface that interfaces the first socket element 102 (see ref. 410).

For the embodiments, the external substrate 106 is placed adjacent to or on the surface of the circuit board substrate 112 and may be a flexible circuit. In one embodiment, the external substrate 106 is a flex circuit such as a polyimide-based flex circuit. In other embodiments, however, the external substrate 106 may be a non-flex circuit. An external substrate 106 that is a flexible circuit may provide certain beneficial characteristics in some embodiments. For example, in one embodiment, a flexible circuit may allow for additional space on the surface of the circuit board substrate 112 for mounting additional components onto the circuit board substrate 112. That is, by using a flexible circuit as the external substrate 106, additional components may be mounted on the surface of the circuit board substrate 112 underneath the external substrate 106 as indicated by ref. 412. In addition, a flexible circuit may provide more tolerance for coupling the flexible circuit (i.e., external substrate 106) to other components. By providing extra tolerance, coupling of the external substrate 106 to other components may be facilitated by providing additional "slack" to properly couple with other components.

Although the first socket element 102 and the second socket element 104 depicted in FIG. 4A are coupled to the circuit board substrate 112 and the external substrate 106 via solder balls 402 and 404, in other embodiments other electrical connectors may be used. For instance, pins, clips, conductive elastomers and other coupling devices may also be employed. For example, in one embodiment, the first socket element 102 and/or the second socket element 104 may be electrically coupled to the circuit board substrate 112 and/or the external substrate 106 using pressure type connection components (e.g., conductive elastomers) such as those that may be used in land grid array connections.

Figure 4B:
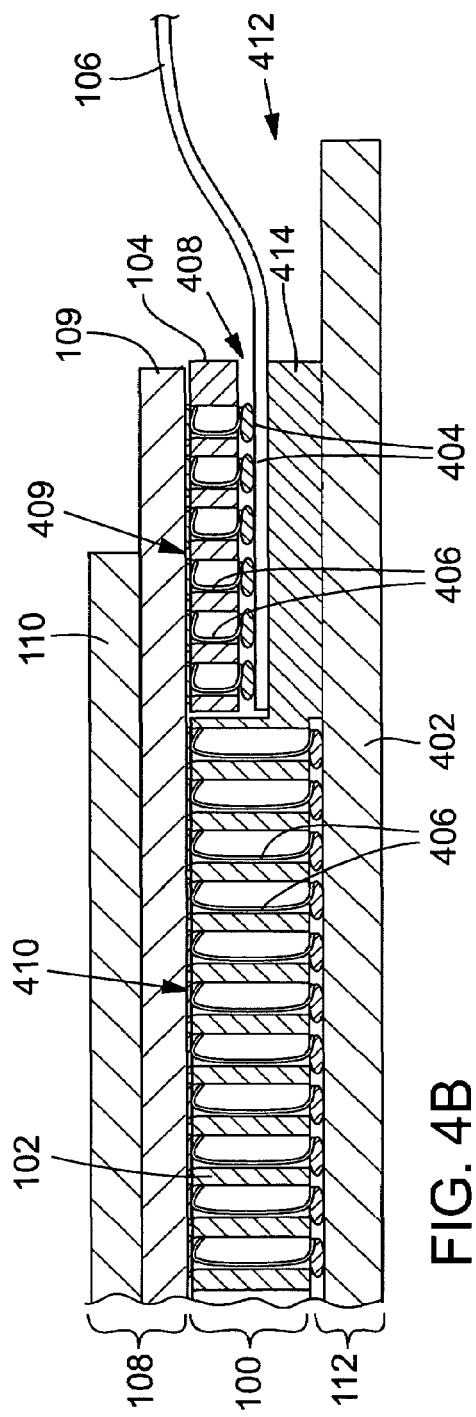
FIG. 4B illustrates a side view of an electronic component, socket and circuit board substrate in accordance with some embodiments.

Referring to FIG. 4B depicting a cross-sectional view of an electronic component 108, socket 100 and circuit board substrate 112 according to some embodiments. For these embodiments, the receiving feature (e.g., gap 116 in FIG. 1) of the first socket element 102 is not a complete cut-through. Instead, the first socket element 102 has a gap bridging portion 414 that bridges the receiving feature (e.g., gap 116). As a result, in these embodiments, the first socket element 102 will not have a true U-shape but instead will have a generally rectangular or O-shape. Further, in these embodiments, the external substrate 106 may rest on top of the gap bridging portion 414 instead of on the surface of the circuit board substrate 112 as in the embodiment depicted in FIG. 4A. In order to accommodate the gap bridge portion 414 note that the second socket element 104 has a significantly smaller profile (e.g., height) than the first socket element 102.

Figure 4C:
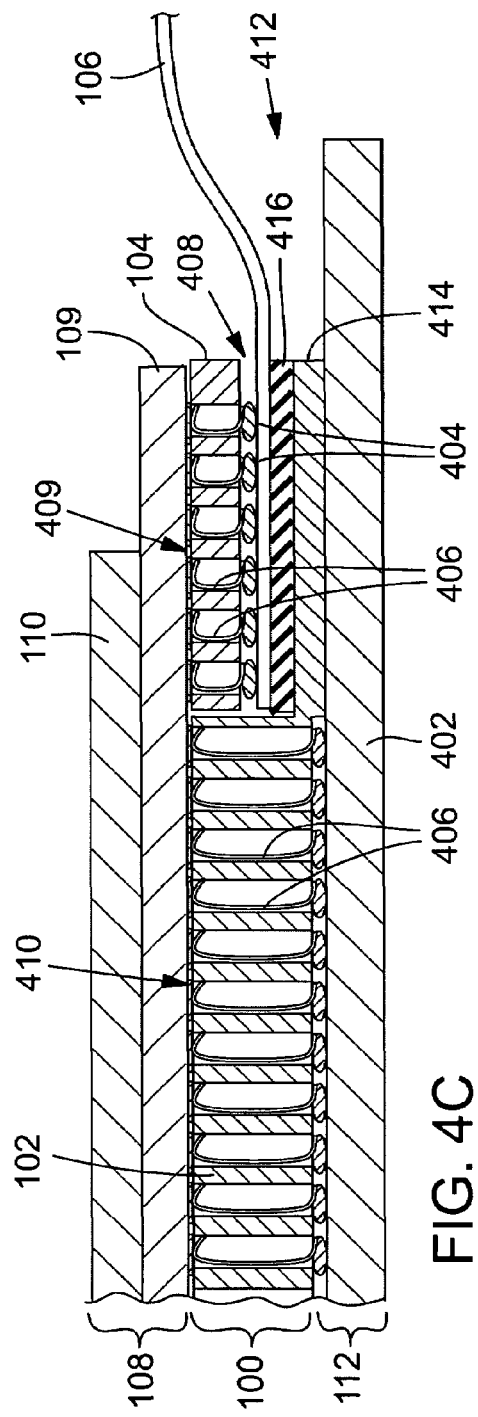
FIG. 4C illustrates a side view of an electronic component, socket and circuit board substrate in accordance with some embodiments.

FIG. 4C depicts a cross-sectional view of an electronic component 108, socket 100 and circuit board substrate 112 according to some embodiments. For these embodiments, the receiving feature (e.g., gap 116 in FIG. 1) of the first socket element 102 is again not a complete cut-through. Instead, as in the previous embodiments, the first socket element 102 has a gap bridging portion 414 that bridges the receiving feature (e.g., gap 116). In addition, a compliant pressure component, in this case, a pressure pad 416 lies on top of the gap bridging portion 414 between the gap bridging portion 414 and the external substrate 106. Such a pressure component (e.g., pressure pad 416), which may be comprised of a elastomeric material, may assure that good electrical contact is maintained between, for example, the second socket element 104 and the package substrate 109.

FIG. 4D depicts a cross-sectional view of an electronic component 108, socket 100 and circuit board substrate 112 according to some embodiments. For these embodiments, the receiving feature (e.g., gap 116 in FIG. 1) of the first socket element 102 is again not a complete cut-through. Again, in these embodiments, the first socket element 102 has a gap bridging portion 414 that bridges the receiving feature (e.g., gap 116). In addition, a compliant pressure component, in this case, springs 420 that have cantilever shapes lie on top of the gap bridging portion 414 between the gap bridging portion 414 and the external substrate 106. Such a pressure component (e.g., springs 420) may assure that good electrical contact is maintained between, for example, the second socket element 104 and the package substrate 109.

FIG. 4E depicts a cross-sectional view of an electronic component 108, socket 100 and circuit board substrate 112 according to some embodiments. For these embodiments, the receiving feature (e.g., gap 116 in FIG. 1) of the first socket element 102 is again not a complete cut-through. Again, in these embodiments, the first socket element 102 has a gap bridging portion 414 that bridges the receiving feature (e.g., gap 116). However, in these embodiments, the receiving feature receives a thick external substrate 420 that may or may not be semi or completely rigid. Note that as with the above embodiments, the profile (e.g., height) of the second socket element 104 is smaller than the first socket element 102 thus facilitating the insertion of such a thick external substrate 420.

Figure 5A:
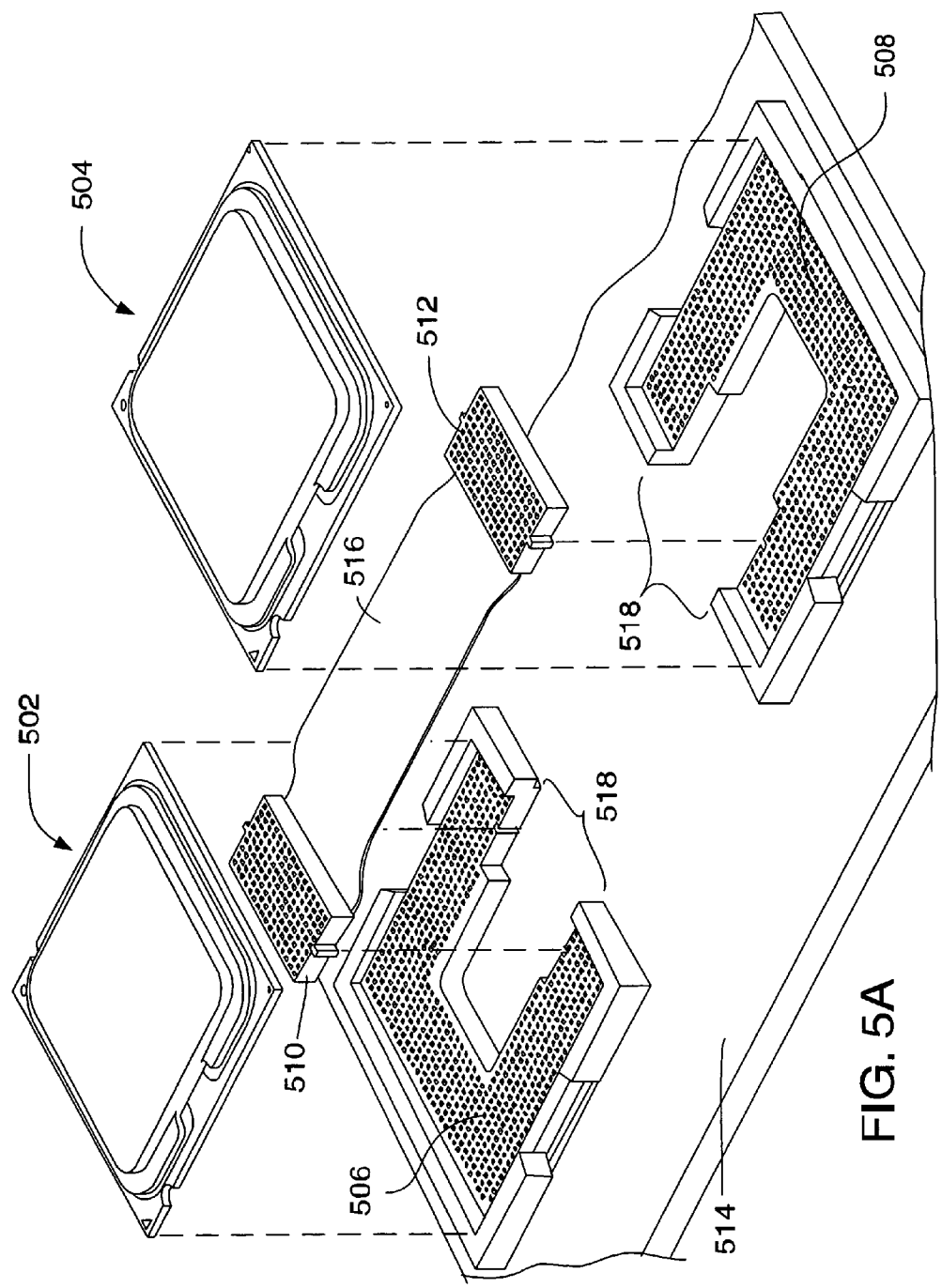
FIGS. 5A to 5D illustrate various views of a circuit board assembly in accordance with some embodiments.
Figure 5B:
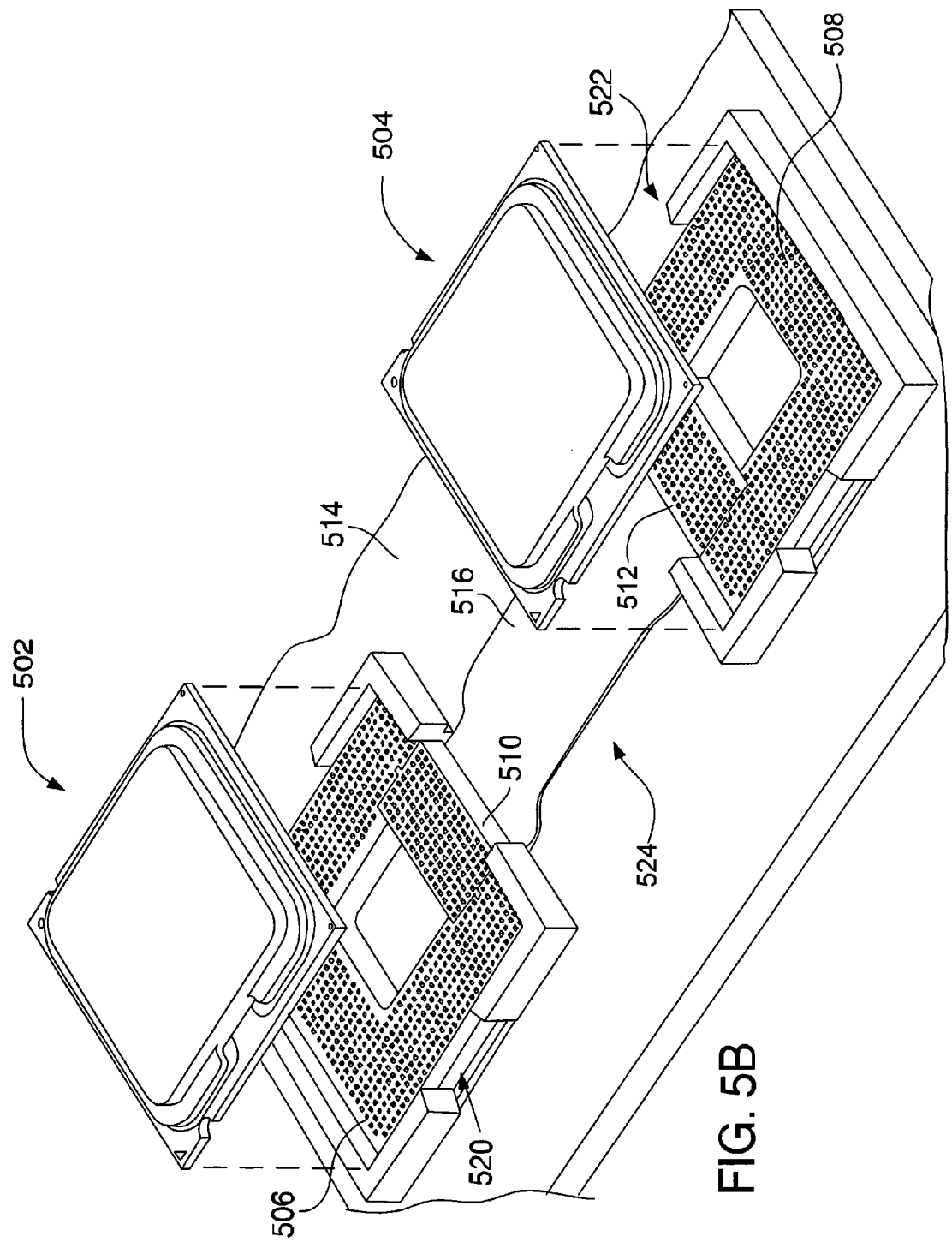
Figure 5C:
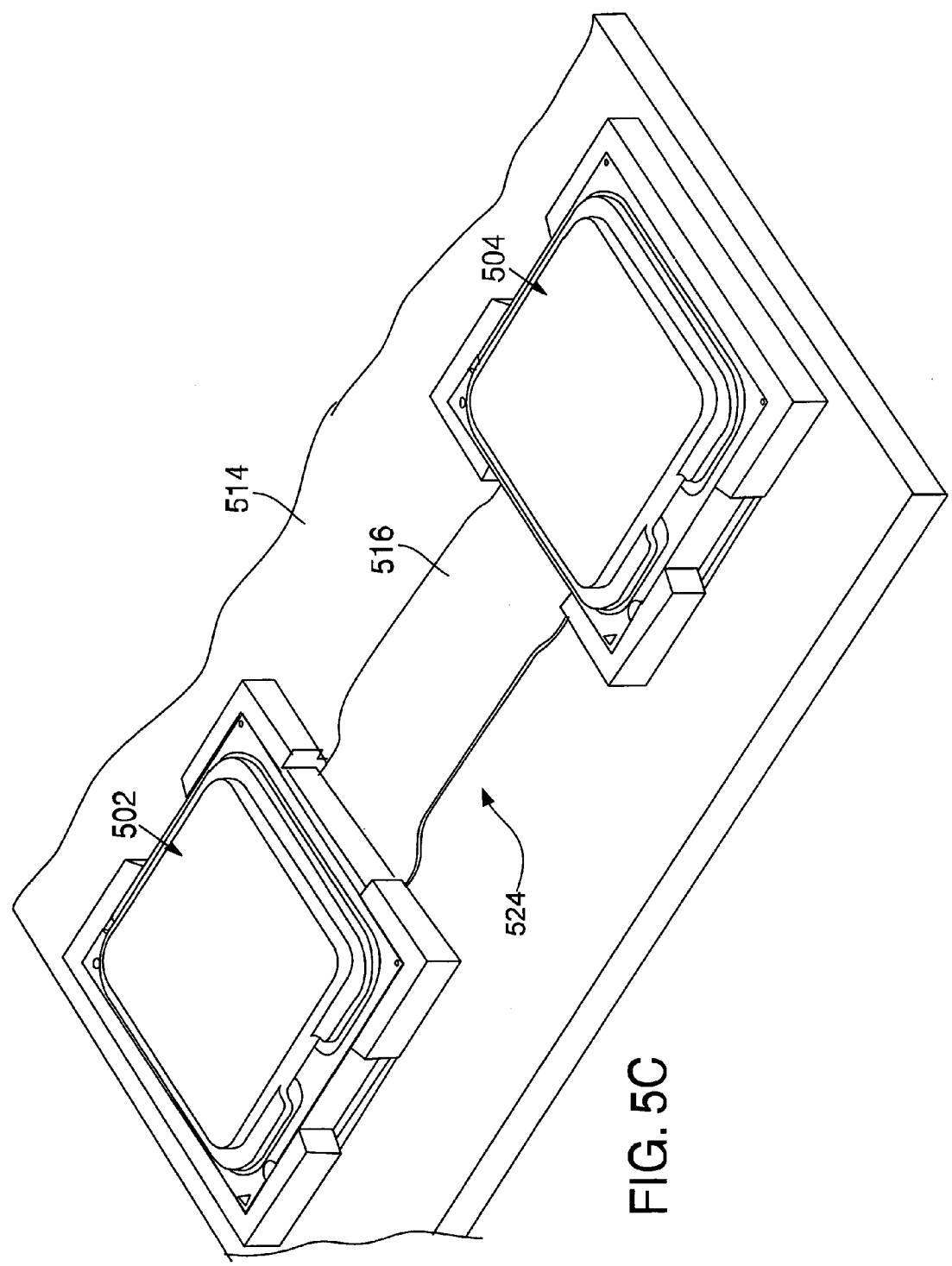

FIGS. 5A to 5C depicts exploded and intact views of a circuit board assembly with two electronic components, in this case, two electronic packages, coupled together by two surface mounted receivers and a external substrate according to some embodiments. For these embodiments, two electronic packages, a first electronic package 502 and a second electronic package 504, are mounted on top of first socket elements 506 and 508 and second socket elements 510 and 512. The first socket elements 506 and 508 are on a circuit board substrate 514. The second socket elements 510 and 512 are coupled together by an external substrate 516. For the embodiments, the second socket elements 510 and 512 may be inserted into gaps 518 of the first socket elements 506 and 508 to form complete sockets 520 and 522 as depicted in FIG. 5B.

In various embodiments, the external substrate 516 may be a flexible circuit that may facilitate the coupling of the external substrate 516 to the second socket elements 510 and 512. In some embodiments, additional components may be mounted onto the surface of the circuit board substrate 514 underneath the external substrate 516 (as indicated by ref. 524 in FIGS. 5B and 5C).

In some embodiments, the external substrate 516 may transfer higher speed signals between the two electronic packages 502 and 504 through multiple signal paths that may be present in the external substrate 516. For these embodiments, slower signals, ground and/or power may transfer between the electronic packages 502 and 504 and/or other components through the first socket elements 506 and 508 and through the circuit board substrate 514.

Figure 5D:
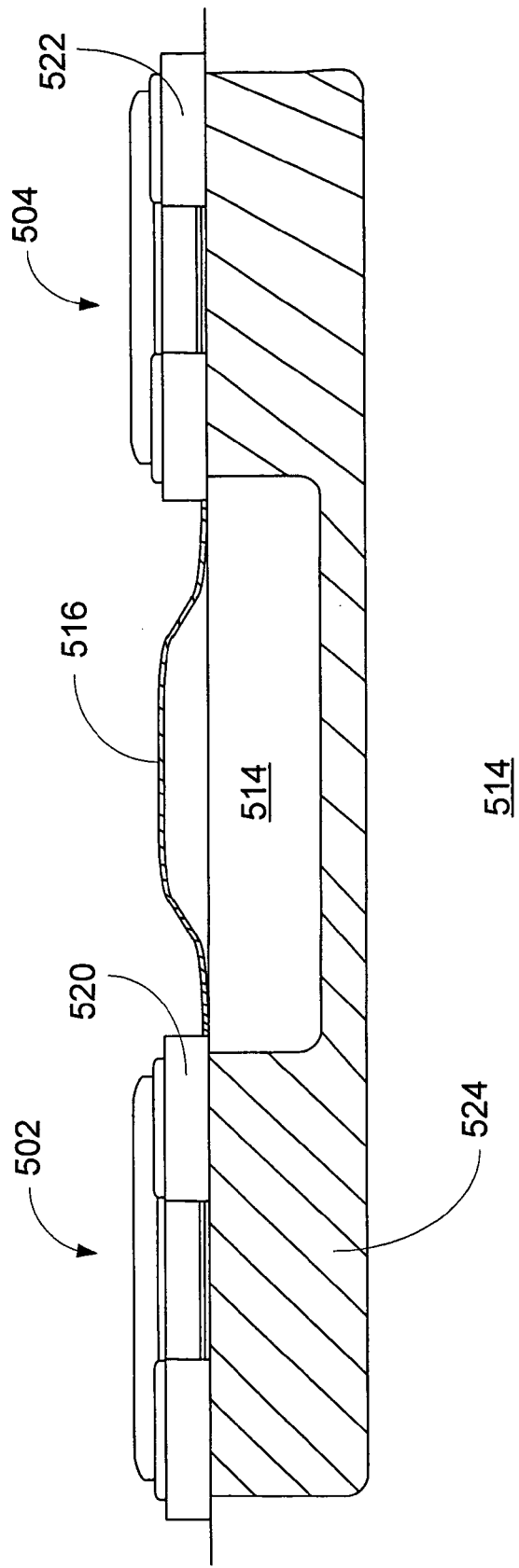

FIG. 5D depicts a partial split side view of the circuit board assembly of FIGS. 5A to 5C in accordance with various embodiments. For the embodiments, the two electronic packages 502 and 504 are electrically coupled by the external substrate 516 and circuit board signal paths 524 that are integral of or embedded within the circuit board substrate 514. As previously described, in various embodiments, higher speed signal may transfer between the two electronic packages 502 and 504 through external substrate 516 while slower speed signals may transfer between the two electronic packages 502 and 504 via circuit board signal paths 524 which, in this case, are conductive interconnects (such as vias and traces). Although not depicted, the circuit board signal paths 524 may further be coupled with other components and may facilitate ground and power for the electronic packages 502 and 506. Note that although in FIG. 5D (as well as in FIG. 6D) the circuit board signal paths 524 are depicted as being underneath the surface of the circuit board substrate 514, in other embodiments, one or more of the circuit board signal paths 524 may actually be located on the surface of the circuit board substrate 514.

In various embodiments, the circuit board signal paths 524 may include a plurality of traces and vias that form multiple signal paths between the two electronic packages 502 and 504. The circuit board signal paths 524 may also include one or more paths for ground and power, which may be directed away from the two electronic packages 502 and 504.

Figure 6A:
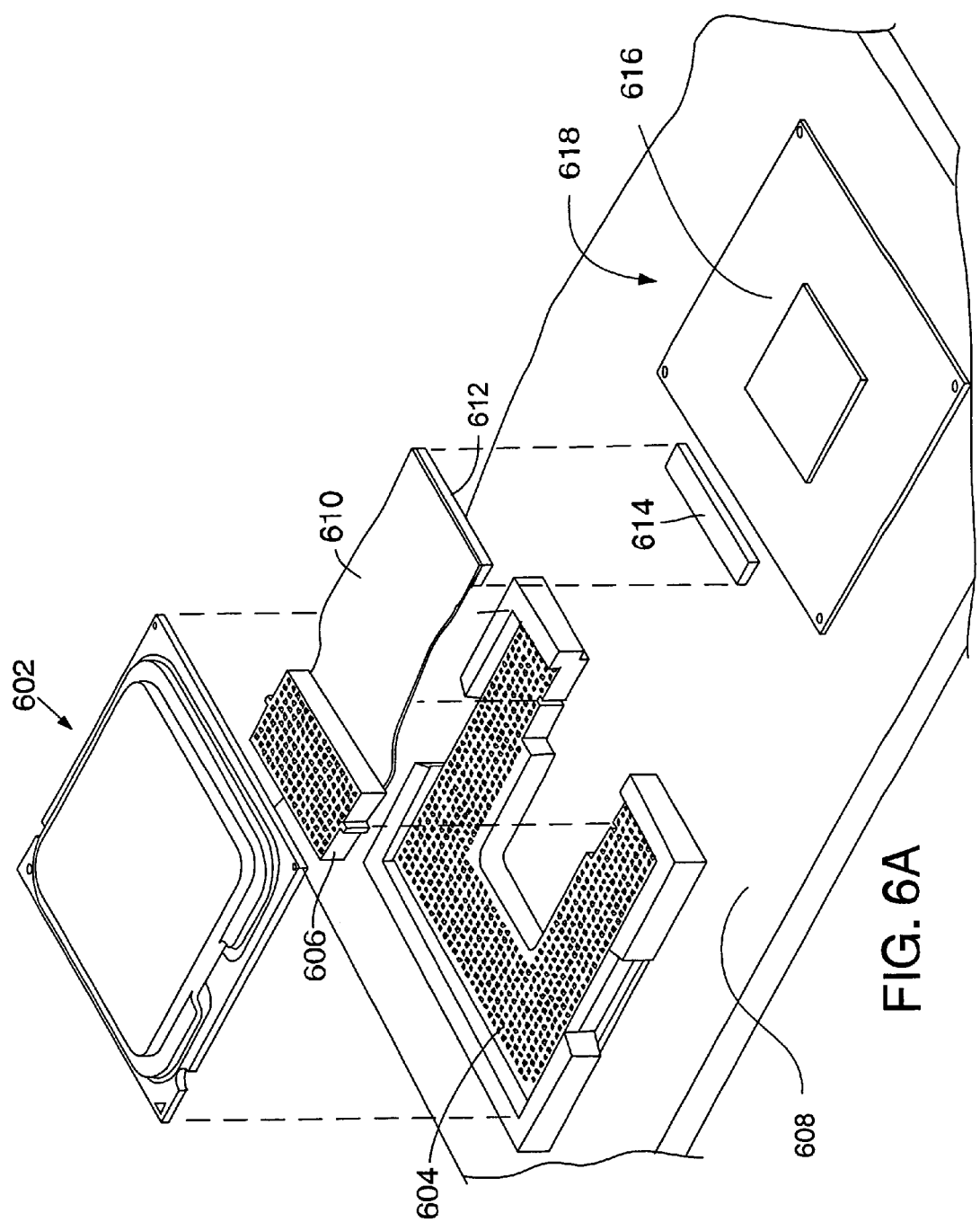
FIGS. 6A to 6D illustrate various views of a circuit board assembly in accordance with some embodiments.
Figure 6B:
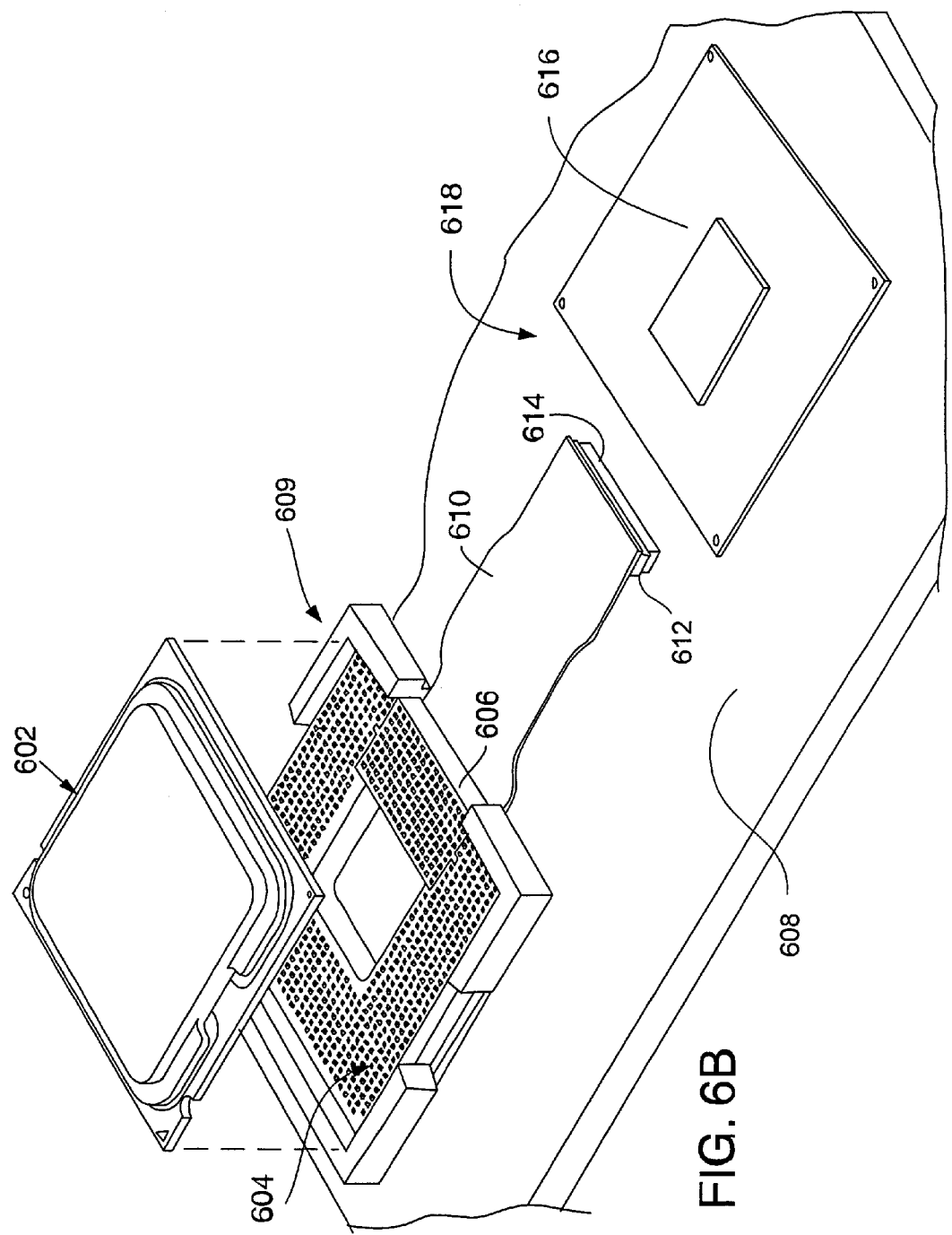
Figure 6C:
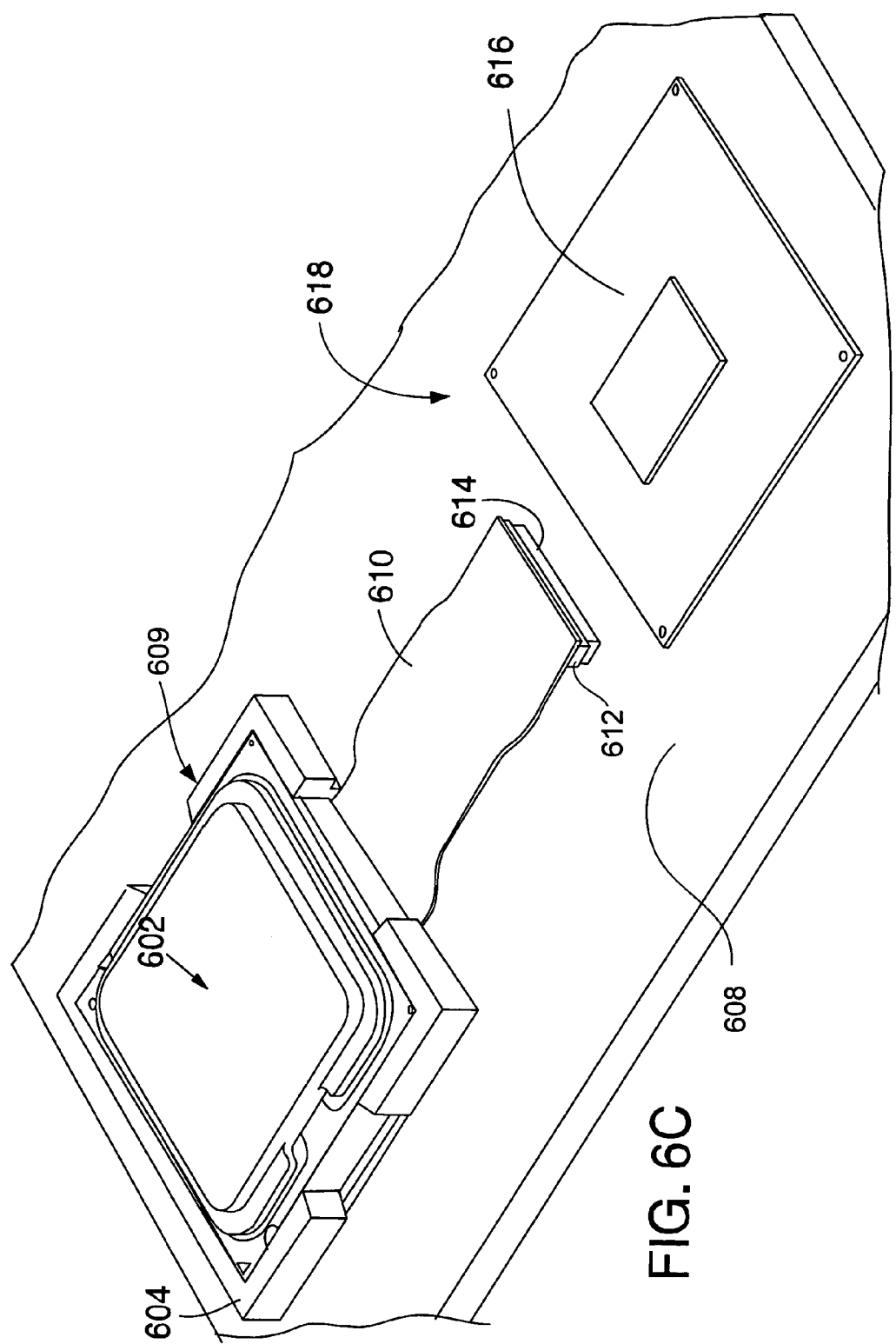

FIGS. 6A to 6C depicts various exploded and intact views of a circuit board assembly with a first electronic component, an electronic package, coupled to second electronic component, a chipset, by an external substrate, according to some embodiments. For the embodiments, an electronic package 602 is mounted onto a first socket element 604 and a second socket element 606. The first socket element 604 and second socket element 606 are located on a circuit board substrate 608. The first socket element 604 and the second socket element 606 combining to form a surface mounted receiver or, in this case, a socket 609 (see FIGS. 6B and 6C).

The second socket element 606 is coupled to an external substrate 610 at one end of the external substrate 610. At the other end of the external substrate 610, the external substrate 610 may be coupled to a connector 612. In various embodiments, the external substrate 610 may include a plurality of signal paths. The connector 612, in turn, may be coupled to a circuit board connector 614 that is coupled to the surface 618 of the circuit board 608 (see FIGS. 6B and 6C). The circuit board connector 614 may be electrically coupled to a chipset 616 through interconnects that run underneath and/or on the surface 618 of the circuit board substrate 608.

For these embodiments, it may be beneficial to locate the circuit board connector 614 close to the electronic package (e.g., chipset 616). That is, in some embodiments, the circuit board substrate 608 may be comprised of a dielectric that has a relatively high electrical loss tangent value such as an FR4 dielectric. Therefore, significant signal loss may occur as a signal is traveling between the circuit board connector 614 and chipset 616 if the distance between the two is large. The amount of loss, of course, will depend on several factors including, for example, the frequencies of the signals being transmitted and the actual distance being traveled through the circuit board substrate 608 by the signal. By locating the circuit board connector 614 close to the directly soldered or bonded electronic package (e.g., chipset 616), signal loss that may occur between the circuit board connector 614 and for example, the chipset 616, may be reduced.

Figure 6D:
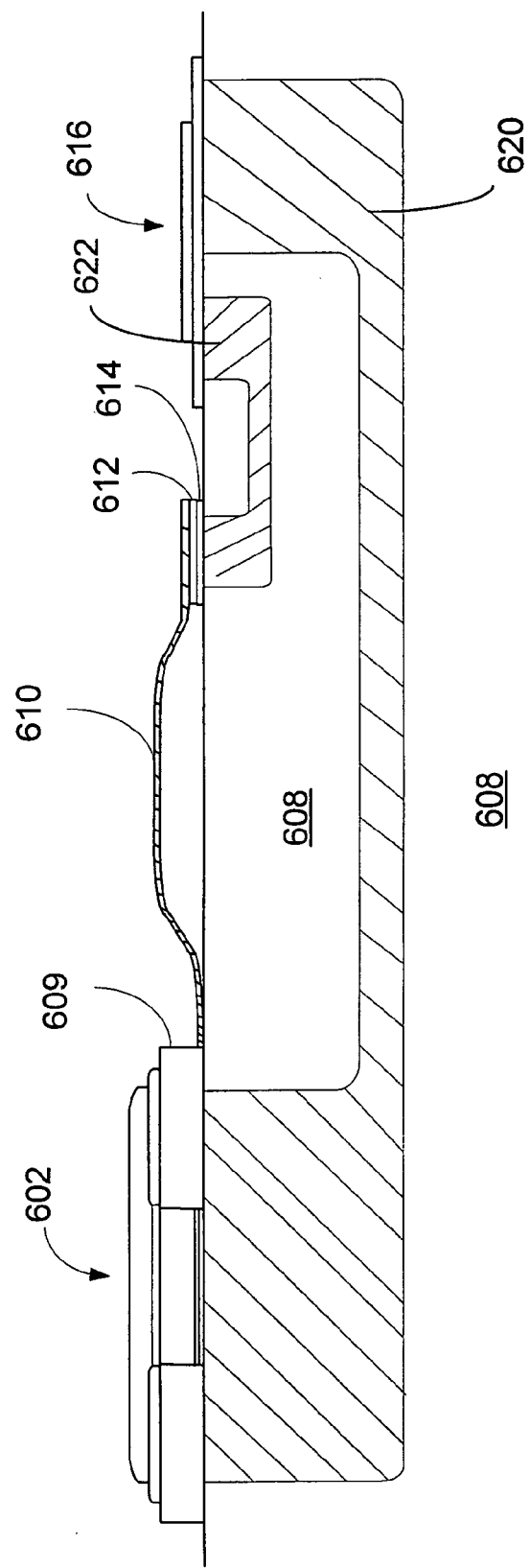

FIG. 6D depicts a partial split side view of the circuit board assembly of FIGS. 6A to 6C in accordance with various embodiments. For the embodiments, the electronic package 602 and the chipset 616 are directly coupled via first circuit board signal paths 620 that is integral of or embedded within the circuit board substrate 608. The electronic package 602 and the chipset 616 are further coupled by the external substrate 610 external to the circuit board substrate 620 along with second circuit board signal paths 622. In various embodiments, higher speed signal may transfer between the electronic package 602 and the chipset 616 through external substrate 610 and the second circuit board signal paths 622 while slower speed signals may transfer between the electronic package 602 and the chipset 616 via the first circuit board signal paths 620.

In various embodiments, the first circuit board signal paths 620 may include a plurality of traces and vias that form multiple signal paths between the electronic package 602 and the chipset 616. The first circuit board signal paths 620 may also include one or more paths for ground and power, which may be directed away from the electronic package 602 and the chipset 616. Although not shown, the first circuit board signal paths 620 may further be coupled with other circuit board components.

Unlike the embodiment depicted in FIGS. 5A to 5D, the signals being transmitted through the external substrate 610 for this embodiment are not carried entirely through the external substrate 610. Instead, the signals being transmitted through the external substrate 610 must travel through the second circuit board signal paths 622 between the circuit board connector 614 and the chipset 616.

In addition to the embodiments described above, other configurations are possible in other embodiments. For example, in other embodiments, two electronic packages that are both bonded or soldered directly on to a circuit board substrate may also be coupled via an external substrate using, for example, two circuit board connectors. Further, in some embodiments, more than two electronic packages may be linked together on a circuit board substrate via multiple external substrates.

Other embodiments includes, for example, a socket that includes more than two socket elements such as a socket having three, four, five or more socket elements, where three or more of the socket elements may be coupled to three or more substrates. In such embodiments, the three or more substrates may be coupled to two or more electronic components thus linking the socket to multiple electronic components through three or more substrates.

Figure 7A:
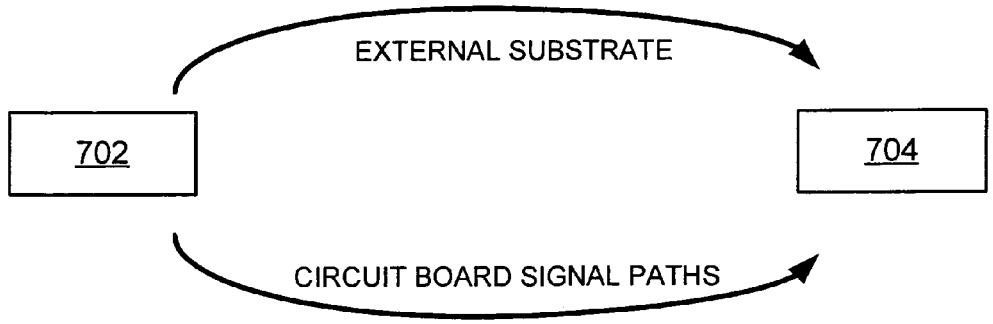
FIGS. 7A to 7C are block diagrams of signals being exchanged between two electronic components through an external substrate and circuit board signal paths in accordance with some embodiments.
Figure 7B:
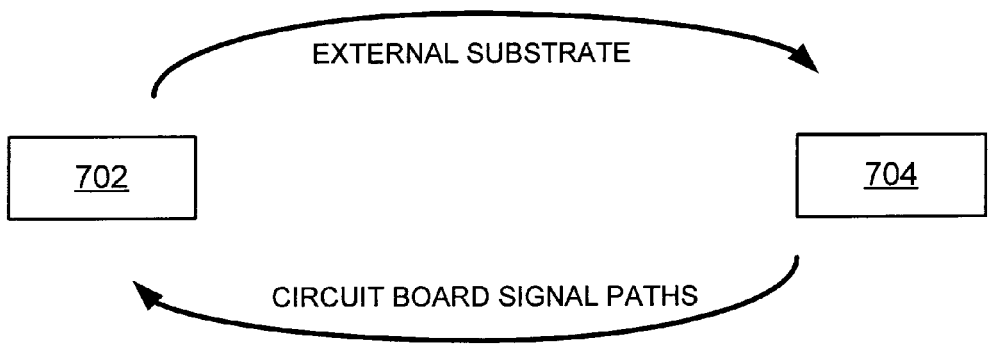
Figure 7C:
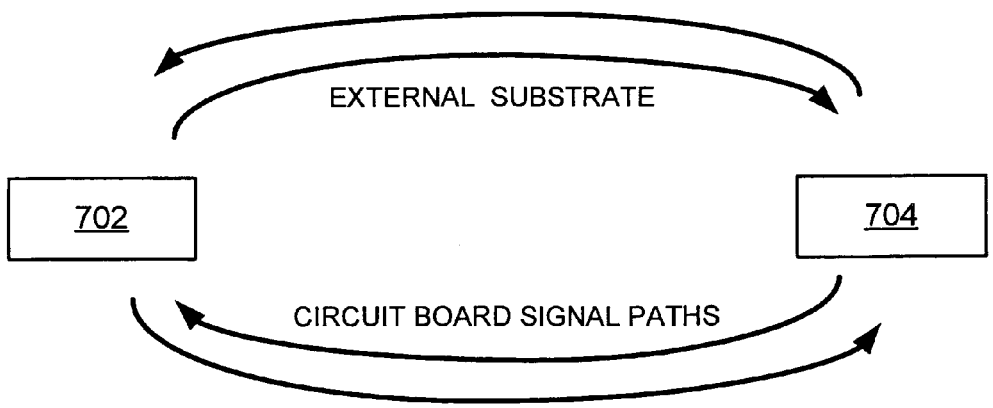

Referring to FIGS. 7A to 7C depicting signals being exchanged between two electronic components 702 and 704 through two sets of signal paths, a plurality of external substrate signal paths and a plurality of circuit board signal paths according to various embodiments. For the embodiments, the external substrate signal paths and the circuit board signal paths being physically disjoined or separated from each other. In these embodiments, the external substrate signal paths and the circuit board signal paths may be bi-directional and/or unidirectional. In various embodiments, a plurality of signals having different speeds may be carried by each set of signal paths.

FIG. 7A depicts a first electronic component 702 transmitting signals to a second electronic package 704 via external substrate signal paths and circuit board signal paths as depicted in accordance with one embodiment. For this embodiment, the second electronic component 704 may be a slave or servant component to the first electronic component 702 only receiving signals from the first electronic component 702 and not transmitting signals to the first electronic component 702. As a result, for this embodiment, signals are only transmitted in one direction. In various embodiments, the transmitted signals carried through the external substrate signal paths may be signals of higher speed than the signals carried by the circuit board substrate paths. In some embodiments, signals of different speeds may even propagate within the same set of signal paths (e.g., external substrate signal paths or circuit board signal paths). Thus, for example, the external substrate signal paths may, by themselves, carry signals of different speeds.

According to another embodiment, the first electronic component 702 may transmit signals to the second electronic component 704 through only the external substrate signal paths and not through the circuit board signal paths as depicted in FIG. 7B. For this embodiment, the first electronic component 702 may, however, receive signals from the second electronic component 704 via the circuit board signal paths. In this embodiment, the external substrate signal paths and the circuit board signal paths are not bi-directional. That is, note that in this embodiment, all signals traveling through a particular set of signal path (i.e., the external substrate signal paths or the circuit board signal paths) are traveling in one direction only. Again, as in the embodiment depicted in FIG. 7A, signals being carried by the external substrate signal paths may be higher speed signals than the signals carried by the circuit board signal paths. Also again, each set of signal paths (e.g., external substrate signal paths or circuit board signal paths) may carry signals of different speeds.

According to another embodiment, each set of signal paths (external substrate signal paths and the circuit board signal paths) may allow bi-directional signal transmissions as depicted in FIG. 7C. For this embodiment, the first electronic component 702 may transmit or receive signals from the second electronic component 704 through both the external substrate signal paths and the circuit board signal paths. Again, as in the embodiments depicted in FIGS. 7A and 7B, signals being carried by the external substrate signal paths may be higher speed signals than the signals carried by the circuit board signal paths. Also again, each set of signal paths (e.g., external substrate signal paths or circuit board signal paths) may carry signals of different speeds.

In some embodiments, the signals being transmitted and received by an electronic component may use the same and/or different signal paths (i.e., external substrate signal paths and/or circuit board signal paths) for transmitting and receiving signals. For example, in some embodiments, the first electronic component 702 may use the same external substrate signal paths for transmitting and receiving signals to and from the second electronic component 704. Such signal paths may represent true bi-directional signal paths. Similarly, the first electronic component 702 may use the same circuit board signal paths for both receiving and transmitting signals to and from the second electronic component 704. In other embodiments, however, the first electronic component 702, may use, for example, only specific external substrate paths for receiving signals from the second electronic component 704, while other external substrate paths may be used only for transmitting signals to the second electronic component 704. Similarly, for such embodiments, some of the circuit board substrate paths may be dedicated for transmitting signals from the first electronic component 702 to the second electronic component 704 while other circuit board substrate paths may be dedicated for receiving signals by the first electronic component 702 from the second electronic component 704. In yet other embodiments, the signals paths used by, for example, the first electronic component 702 may include a combination of both bi-directional signal paths as well as one or unidirectional signal paths (external substrate signal paths and/or circuit board signal paths).

In the following, examples of different signaling schemes between the first and the second electronic components 702 and 704 via the circuit board signal paths and/or the external substrate signal paths are provided according to various embodiments.

In the first example, the first electronic component 702 transmits a plurality of first signals at a first signal speed through the circuit board signal paths to the second electronic component 704. The first electronic component 702 further transmits a plurality of second signals at a second signal speed through the external substrate signal paths to the second electronic component 704. In various embodiments, the second signal speed may be higher than the first signal speed. In some embodiments, the second electronic component 704 may transmit and the first electronic component 702 may receive, a plurality of third signals at a third signal speed via either the circuit board signal paths or the external substrate signal paths. If the plurality of third signals are received through the circuit board signal paths, then the third signal speed of the plurality of third signals may be lower than the second signal speed of the plurality of second signals and may be equal to the first signal speed of the plurality of first signals. In some embodiments, at least some of the first and third signals may be transmitted and received through the same signal paths (e.g., bi-directional circuit board signal paths). If, on the other had, the plurality of third signals are received by the first electronic component 702 through the external substrate signal paths, then the third signal speeds of the plurality of third signals may be higher than the first signal speed of the plurality of first signals and may be equal to the second signal speed of the plurality of second signals. In some embodiments, at least some of the second and third signals may be transmitted and received thorough the same signal paths (e.g., bi-directional external substrate signal paths).

In a second example, the second electronic component 704 may transmit and the first electronic component 702 may receive, a plurality of first signals at a first signal speed via the circuit board signal paths. The second electronic component 704 may further transmit and the first electronic component 702 may further receive, a plurality of second signals at a second signal speed via the external substrate signal paths. In some embodiments, the first electronic component 702 may transmit and the second electronic component 704 may receive, a plurality of third signals at a third signal speed via either the circuit board signal paths or the external substrate signal paths. In some embodiments, the second signal speed of the plurality of second signals may be higher than the first signal speed of the plurality of first signals.

In a third example, the first electronic component 702 may transmit and the second electronic component 704 may receive, a plurality of first signals at a first signal speed via the circuit board signal paths. In this example, the second electronic component 704 may transmit and the first electronic component 702 may receive, a plurality of second signals at a second signal speed via the external substrate signal paths. In some embodiments, the second signal speed of the plurality of second signals may be higher than the first signal speed of the plurality of first signals.

Referring now to FIG. 8, where a system 800 in accordance with some embodiments is shown. The system 800 includes a microprocessor 802 that may be coupled to a bus 804. The system 800 may further include temporary memory 806, a network interface 808, an optional non-volatile memory 810 and an input/output (I/O) device interface unit 812. In some embodiments, the input/output device interface unit 812 may be a keyboard, a cursor control device and/or other I/O device. One or more of the above enumerated elements, such as microprocessor 802, temporary memory 806, non-volatile memory 810, and so forth, may be coupled to the novel circuit board apparatuses described above.

Depending on the applications, the system 800 may include other components, including but not limited to chipsets, RF transceivers, mass storage (such as hard disk, compact disk (CD), digital versatile disk (DVD), graphical or mathematic co-processors, and so forth.

One or more of the system components may be located on a single chip such as a system on chip (SOC). In various embodiments, the system 800 may be a personal digital assistant (PDA), a wireless mobile phone, a tablet computing device, a laptop computing device, a desktop computing device, a set-top box, an entertainment control unit, a digital camera, a digital video recorder, a media recorder, a media player, a CD player, a DVD player, a network server, or device of the like.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An apparatus, comprising:
    a substrate;
    a first portion of a first socket disposed at a first end of the substrate, and adapted to at least contribute towards completing the first socket, the first socket to receive a first component, and having at least two portions, said first portion and first at least one other portion;

a second portion of a second socket disposed at a second end of the substrate, and adapted to at least contribute towards completing the second socket, the second socket to receive a second component, and the second socket having at least two portions, said second portion and second at least one other portion; and the first and second portions and the substrate are further adapted to facilitate the first and second components to communicate with each other through the first and second portions and the substrate at a first signaling speed, that is different from a second signal speed the first and second components communicate with each other through the first and second at least one other portions.

2. The apparatus of claim 1, wherein the substrate comprises a dielectric selected from the group consisting of a polytetrafluoroethylene (PTFE), a polyimide and a liquid crystal polymer dielectric.

3. The apparatus of claim 1, wherein the substrate comprises a dielectric having an electrical loss tangent of less than or equal to about 0.010.

4. The apparatus of claim 1, wherein the substrate is a flex circuits and the first signal speed is faster than the second signal speed.

5. The apparatus of claim 1, wherein the first component comprises a central processing unit, and the first socket comprises a land grid array socket.

6. The apparatus of claim 1, wherein the substrate is a printed circuit board, and the second signal speed is faster than the first signal speed.

7. A system comprising:
a circuit board having:
  a first portion of first socket disposed at a first location of the circuit board, and adapted to at least contribute towards completing the first socket, the first socket to receive a first component, and having at least two portions, said first portion and first at least one other portion;
  a second portion of a second socket disposed at a second location of the circuit board, adapted to at least contribute towards completing the second socket, the second socket to receive a second component, and the second socket having at least two portions, said second portion and second at least one other portion; and
  the first and second portions and the circuit board are further adapted to facilitate the first and second components to communicate with each other through the first and second portions and the circuit board at a first signal speed, that is different from a second signal speed the first and second components communicate with each other through the first and second at least one other portions; and
a mass storage device coupled to the circuit board.

8. The system of claim 7, wherein the system further comprises
  a connector apparatus to couple said first portion of the first socket to said second portion of the second socket, having
    a substrate,
    a third portion of the first at least one other portion of the first socket disposed at a first end of the substrate, and adapted to cooperate with the first portion of the first socket to receive the first component,
    a fourth portion of the second at least one other portion of the second socket disposed at a second end of the substrate, and adapted to cooperate with the second socket to receive the second component, and
    the third and fourth portions and the substrate are further adapted to facilitate the first and second components to communicate with each other through the third and fourth portions and the substrate at the second signaling speed.

9. The system of claim 8, wherein the second signal speed is faster than the first signal speed.

10. The system of claim 7, wherein the system is selected from a group consisting of a set-top box, a media recorder, and a media player.

11. The system of claim 10, wherein the first component comprises a central processing unit, and the first socket comprises a land grid array socket.

* * * * *

UNITED STATES PATENT AND TRADEMARK OFFICE
CERTIFICATE OF CORRECTION

PATENT NO. : 6,971,887 B1  Page 1 of 1
APPLICATION NO. : 10/877323
DATED : December 6, 2005
INVENTOR(S) : Trobough It is certified that error appears in the above-identified patent and that said Letters Patent is hereby corrected as shown below:

Column 3
Line 49, "...socket element 102..." should read --...first socket element 102...--.

Column 5
Line 45, "...extended walls 302." should read --...extended retaining walls 302.--.

Column 6
Lines 34, "...package substrate 112..." should read --...package substrate 109--.
Lines 22-23, "...component t 108." should read --...component 108.--
Lines 31-32, "...second socket element 106..." should read --...second socket element 104...--.

Column 7
Line 18, "...gap bridge portion 414..." should read --...gap bridging portion 414...--.
Line 45, "...springs 420..." should read --...springs 418...--.

Column 9
Line 8, "...circuit board 608..." should read --...circuit board substrate 608...--.

Column 10
Line 22, "...second electronic package 704..." should read --...second electronic component 704...--.

Signed and Sealed this

Fourth Day of December, 2007

JON W. DUDAS
*Director of the United States Patent and Trademark Office*